US010298112B2

(12) United States Patent
Knoedgen et al.

(10) Patent No.: US 10,298,112 B2
(45) Date of Patent: May 21, 2019

(54) CIRCUIT FOR DRIVING A POWER SWITCH

(71) Applicants: Dialog Semiconductor Inc., Campbell, CA (US); Dialog Semiconductor (UK) Limited, London (GB)

(72) Inventors: Horst Knoedgen, Munich (DE); Christoph Nagl, Graz (AT); Nebojsa Jelaca, Graz (AT); Kun Yang, Gilroy, CA (US); Jung Woo Choi, Pleasanton, CA (US)

(73) Assignees: Dialog Semiconductor, Inc., Campbell, CA (US); Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/719,997

(22) Filed: Sep. 29, 2017

(65) Prior Publication Data

US 2019/0103804 A1    Apr. 4, 2019

(51) Int. Cl.
| | |
|---|---|
| *H02M 1/096* | (2006.01) |
| *H03K 17/687* | (2006.01) |
| *H02M 3/337* | (2006.01) |
| *H02M 3/335* | (2006.01) |
| *H03K 17/567* | (2006.01) |

(52) U.S. Cl.
CPC .......... *H02M 1/096* (2013.01); *H02M 3/337* (2013.01); *H02M 3/33507* (2013.01); *H03K 17/567* (2013.01); *H03K 17/687* (2013.01)

(58) Field of Classification Search
CPC .......................... Y10T 307/747; Y10T 307/76
See application file for complete search history.

(56) References Cited

U.S. PATENT DOCUMENTS

| | | | |
|---|---|---|---|
| 2013/0241621 A1* | 9/2013 | Forghani-Zadeh | ......................... H03K 17/08122 327/315 |
| 2015/0077081 A1* | 3/2015 | Ejury | .................... H02M 7/538 323/282 |

* cited by examiner

*Primary Examiner* — Fritz M Fleming
(74) *Attorney, Agent, or Firm* — Saile Ackerman LLC; Stephen B. Ackerman

(57) ABSTRACT

A circuit for driving a power switch is presented. The circuit includes a first power switch coupled to a second power switch via a switching node and a driver coupled to the first power switch, where the driver contains an energy storing element coupled to the switching node. The circuit also contains a sensor to sense an electrical parameter of the driver and a charger coupled to the sensor. The charger provides a charge current to charge the energy storage element, and to control the charge current based on the electrical parameter. In particular, a circuit for driving a power switch based on a III/V semiconductor is presented. In addition, a method of powering a power switch driver is presented. The method includes sensing an electrical parameter of the driver and adjusting a current to charge the energy storing element based on the electrical parameter.

16 Claims, 5 Drawing Sheets

CIRCUIT FOR DRIVING A POWER SWITCH

TECHNICAL FIELD

The present disclosure relates to a circuit for driving a power switch. In particular the present disclosure relates to a circuit for driving a power switch based on a III/V semiconductor.

BACKGROUND

Devices based on III/V semiconductors such as Gallium Nitride, GaN, diodes and GaN N-channel transistors, have a number of advantageous properties. For instance, GaN transistors have a relatively low on-resistance and can achieve higher switching speed compared to their silicon-based counterpart. As such, GaN components are well suited for the design of switching converters and high-voltage power circuits.

However, GaN devices such as enhancement or depletion mode high-electron-mobility transistor E-HEMT and D-HEMT, require an accurate gate voltage in order to fully turn on with a low on-resistance (Rds_on) value. A typical voltage gate value may in the order of 6V, however the gate voltage may vary from device to device depending on the manufacturing process. Driving a GaN transistor with a higher gate voltage can cause severe degradation and overstress to the GaN transistor, hence shortening the life-time of the device. In contrast, driving a GaN transistor with a lower gate voltage can limit the Rds_on performance; for instance, the drain to source voltage may greatly increase.

Switching converters and other electronic circuits comprising a half-bridge topology in which a high side power switch is coupled to a low side power switch via a switching node: the gate voltage of the high-side power switch is provided by a high side driver. The high-side driver is powered by a capacitor often referred to as boot capacitor. Current circuits do not allow a precise and reliable control of the voltage across the boot capacitor, hence limiting their use with GaN transistors.

SUMMARY

It is an object of the disclosure to address one or more of the above-mentioned limitations. According to a first aspect of the disclosure, there is provided an electronic circuit comprising: a first power switch coupled to a second power switch via a switching node; a driver coupled to the first power switch, wherein the driver comprises an energy storing element coupled to the switching node; a sensor to sense an electrical parameter of the driver; and a charger coupled to the sensor and to the energy storing element, the charger being adapted to provide a charge current to charge the energy storage element, and to control the charge current based on the electrical parameter.

For example, the first power switch may be coupled to positive voltage and the second power switch may be coupled to a ground. For example, the energy storing element may be adapted to provide energy to the driver.

Optionally, the electrical parameter comprises at least one of a voltage, a current, a resistance and a temperature. For example, the voltage may be a voltage across the energy storage element or a voltage that is a function of the voltage across the energy storage element.

Optionally, the driver is adapted to provide a drive voltage to the first power switch, and the electrical parameter is indicative of the drive voltage. For example, the electrical parameter may be substantially equal to the drive voltage. The drive voltage may be a gate voltage.

Optionally, the sensor may be adapted to sense the electrical parameter with respect to the switching node.

Optionally, the driver comprises a first transistor adapted to control the drive voltage; and the sensor comprises a second transistor coupled to a first current source; wherein the second transistor is substantially identical to the first transistor.

Optionally, the sensor comprises a comparator adapted to compare a first voltage with a reference voltage, and to generate a control signal to control the charger based on the comparison. For example, the first voltage may be a function of a voltage across the energy storage element. For instance, the first voltage may be substantially equal to the drive voltage.

Optionally, the reference voltage may be adapted to vary with respect to a voltage at the switching node.

Optionally, the sensor comprises a third transistor coupled to the second power switch; and a reference voltage source coupled to the comparator and to the third transistor. For example, the third transistor may be a power switch for sensing the voltage at the switching node.

Optionally, the charger comprises a fourth transistor coupled to a second current source.

Optionally, the charger comprises a second energy storing element coupled to the second current source and to the second power switch.

Optionally, the second power switch is coupled to a ground via a resistance.

Optionally, the circuit is made at least in part based on a III/V semiconductor.

Optionally, the first power switch is based on the III/V semiconductor.

Optionally, the III/V semiconductor comprises Gallium Nitride.

According to a second aspect of the disclosure, there is provided a method of powering a power switch driver comprising an energy storing element, the method comprising sensing an electrical parameter of the driver; and adjusting a current to charge the energy storing element based on the electrical parameter.

Optionally, the driver is adapted to provide a drive voltage to the first power switch, and the electrical parameter is indicative of the drive voltage. For example, the electrical parameter may be the drive voltage, or substantially equal to the drive voltage.

Optionally, the electrical parameter is sensed with respect to a switching node.

Optionally, the method comprises comparing the electrical parameter with a reference, and generating a control signal to adjust the current based on the comparison.

Optionally, the reference is a reference voltage adapted to vary with respect to a voltage at the switching node.

BRIEF DESCRIPTION OF THE DRAWINGS

The disclosure is described in further detail below by way of example and with reference to the accompanying drawings, in which.

DESCRIPTION

Figure 1:
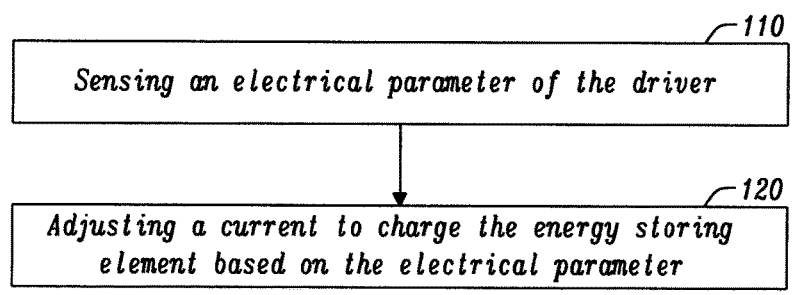
FIG. 1 is a flow chart of a method for powering a driver.

FIG. 1 is a flow chart of a method of powering a driver comprising an energy storing element. For example, the driver may be a high side driver adapted to provide a gate voltage to turn a high side power switch on or off.

At step 110, an electrical parameter of the driver is sensed. The electrical parameter may include at least one of a voltage, a current, a resistance and a temperature. For instance, the electrical parameter may be a measured across the energy storing element. At step 120, a current to charge the energy storing element is adjusted based on the electrical parameter.

Figure 2:
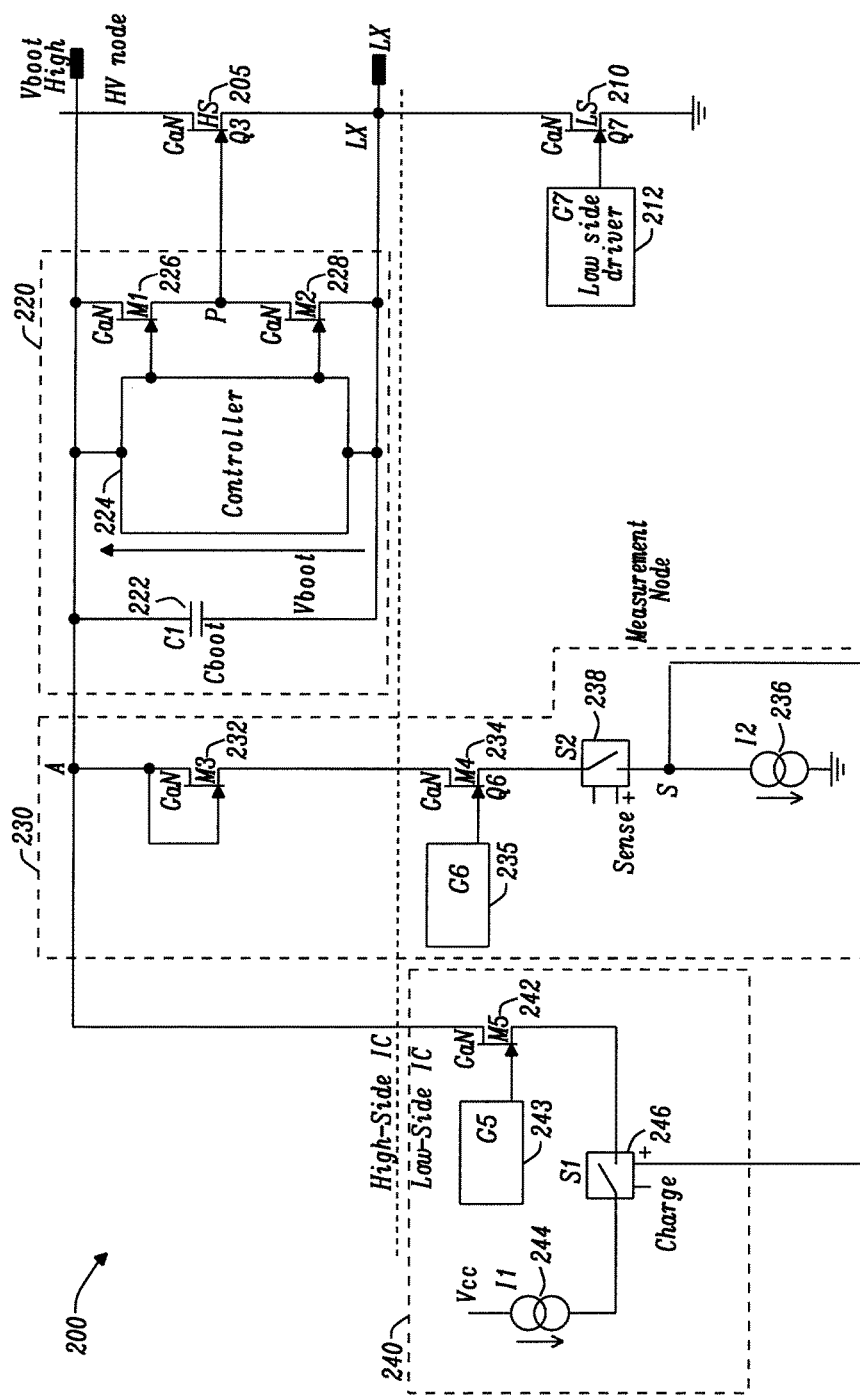
FIG. 2 is a diagram of a circuit for implementing the method of FIG. 1.

FIG. 2 illustrates a diagram of a circuit 200 for implementing the method of FIG. 1. For example, the circuit 200 may be part of a switching converter such as a buck, a boost or a buck-boost converter. The circuit 200 has a first domain based on a GaN semiconductor which includes a plurality of GaN devices, and a second domain based on a silicon semiconductor, which includes other devices such as one or more controllers, voltage and current sources. The second domain may be a complementary metal-oxide-semiconductor, CMOS, integrated circuit.

The circuit 200 includes a half-bridge formed by a high side power switch 205 coupled to a low side power switch 210 via a switching node LX. For example, the switching node may be coupled to an inductor, not shown. A high-side driver circuit 220 is provided for controlling the high-side power switch 205. The high-side driver 220 includes a capacitor Cboot 222 for powering the high-side driver. The capacitor Cboot is coupled to a controller 224 for controlling a push-pull stage formed by a first transistor M1, 226 and a second transistor M2, 228. The first transistor 226 has a first terminal, for example a drain terminal coupled to the positive voltage, a second terminal, for example a source terminal, coupled to a node P, and a third terminal, for example a gate terminal, coupled to the controller 224. The second transistor 228 has a first terminal coupled to the node P, a second terminal coupled to the switching node LX, and a third terminal coupled to controller 224. The capacitor Cboot 222 has a first terminal coupled to a positive voltage Vboothigh and a second terminal coupled to the switching node LX. A low side driving circuit, 212, is provided to drive the low side power switch 210.

A measurement circuit 230 is provided for estimating a voltage at the gate terminal of the high-side power switch (node P). The measurement circuit 230 includes a third and a fourth transistors M3 232, M4 234 coupled to a current source 236 via a current switch 238, also referred to as sensing switch. The third transistor M3, 232 has a first terminal, for example a drain terminal coupled to the high voltage source at node A, a second terminal, for example a source terminal coupled to the fourth transistor M4 234, and a third terminal, for example a gate terminal coupled to the first terminal. The transistor M4 is controlled by a controller 235. The current switch 238 is coupled to the current source 236 via a node S, also referred to as measurement node. The transistor M4 234 is provided to isolate the CMOS integrated chip from the high voltage of the GaN domain when the low-side power switch 210 is off (open). The first terminal of the capacitor Cboot 222 is coupled to the measurement circuit 230 at node A.

A charger circuit 240 for charging the capacitor Cboot 222, is coupled to the measurement circuit 230 and to the high-side driver 220. The charger circuit 240 includes a fifth transistor M5 242, also referred to as charging transistor, controlled by a controller 243. The transistor M5 is coupled to a second current source 244 via a second current switch 246 also referred to as charging switch. The current source 244 is coupled to a voltage Vcc. The current switch 246 is coupled to an output of the measurement circuit 230 at node S. The transistor M5 242 is used to protect the charge circuit from high voltages.

The gate voltage of the high-side power switch 205 is provided via the first transistor M1 226, which may be a source follower transistor. For example, the gate voltage of the high side power switch may be expressed as:

$$V\text{gate}(HS) = V\text{gate}(M1) - V\text{th}(M1) \qquad (1)$$

In a numerical example, the high side power switch may require a gate voltage of 6V and the gate-source threshold voltage Vth of M1 226 may be about 1.5V. In this case the voltage Vboot would need to be adjusted to be equal to 7.5V.

At start up, the capacitor C1 222 is initially discharged, and the controller 224 is turned off as it requires a regulated voltage. The high-side driver will start to operate for a given Vboot value, for example 5V.

The measurement circuit 230 is activated during the low-side conduction phase when the switching node LX is connected to the ground. The transistor M4 234 and the current switch 238 are closed and the current source 236 provides a bias current I2. The bias current I2 creates a voltage drop Vds across the transistor M3 232.

The measurement circuit 230, measures a voltage at node S that is substantially equal to the gate voltage of the high-side power switch Vgs(HS) at node P. The voltage at the measurement node S can be expressed as:

$$V(S) = V(P) = V\text{boot} - V\text{ds}(M3) \qquad (2)$$

This is assuming that the transistors M1 226 and M3 232 are substantially identical such that the voltage drop across transistor M1 226 may be substantially the same as the voltage drop across the transistor M3 232. In other word, the transistor M3 is used to mimic the transistor M1 226.

If the measured voltage at node S is too low, hence less than a given voltage, for instance less than 6V, the current source 244 of the charge circuit 240 is activated to charge the capacitor Cboot up to the required voltage, for example 7.5V. The difference Vcc-Vboot equals a voltage drop at the current source 244.

Using this approach, an accurate voltage Vboot may be provided without the need for a high-side reference.

Figure 3:
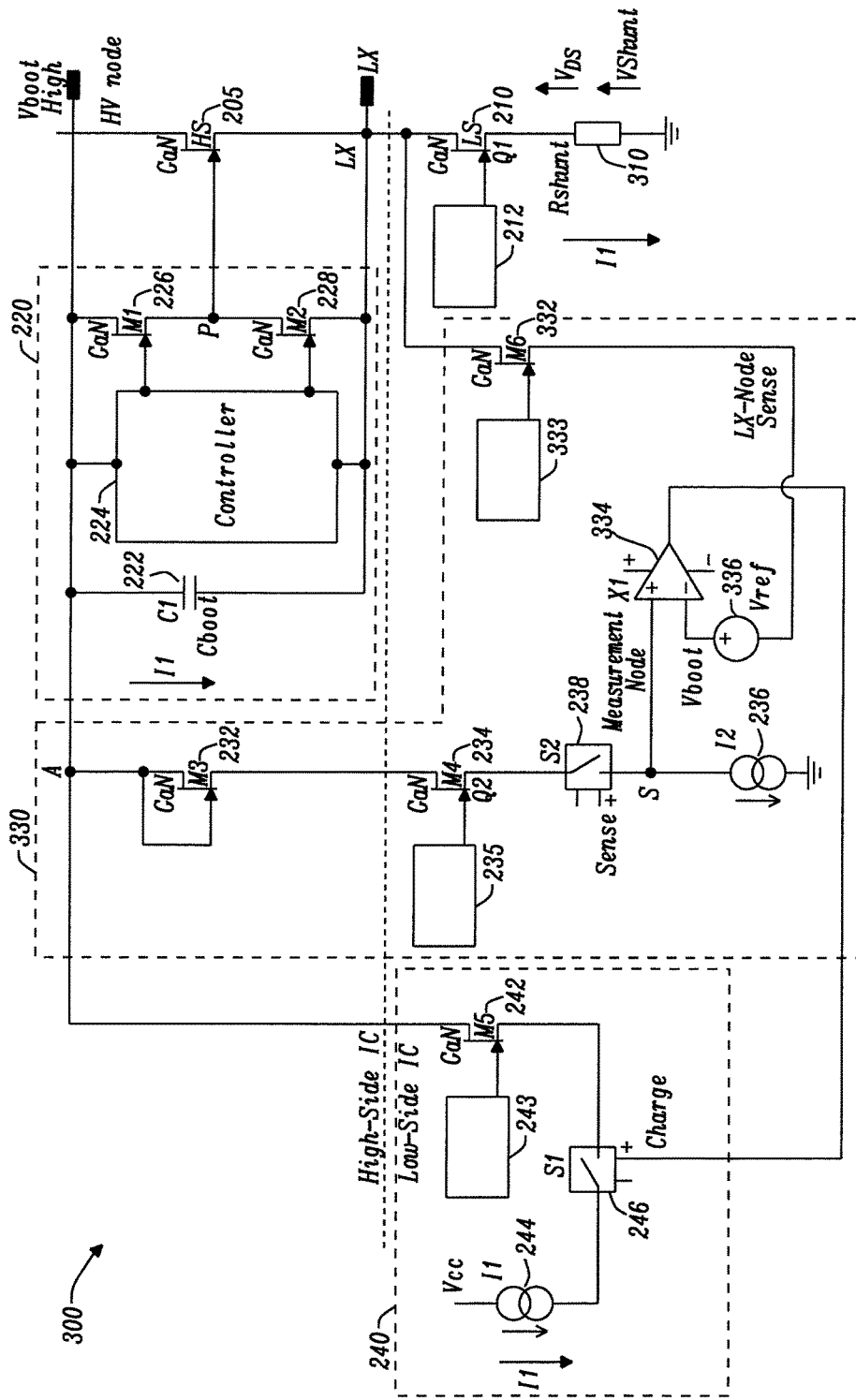
FIG. 3 is diagram of another circuit for implementing the method of FIG. 1.

FIG. 3 illustrates another circuit 300. The converter 300 of FIG. 3 shares many similar components to those illustrated in the circuit 200 of FIG. 2. The same reference numerals have been used to represent corresponding components and their description will not be repeated for sake of brevity.

In the circuit 300 an additional resistance Rshunt 310 is coupled between the low-side power switch 210 and the ground, to perform a measurement of the voltage at the switching node. The resistance Rshunt 310 is very stable compared to the resistance of the low-side power switch. The measurement circuit 330 has been modified to include a sensing transistor M6 332 and a comparator 334. The transistor M6 is coupled to a controller 333, for example, the sensing transistor M6 332 may be a power transistor. The comparator 334 may be an error amplifier. The sensing transistor M6 has a first terminal, for example a drain terminal coupled to the first terminal of the low-side power switch at the LX node, and a second terminal, for example a source terminal coupled to a voltage reference source 336 for providing a voltage Vref.

The comparator 334 has a first input, for example a non-inverting input coupled to node S, a second input, for example an inverting input coupled to the reference voltage source 336, and an output coupled to the current switch 246. Alternatively, the output of the comparator may be coupled to the controller 243 controlling M5.

Using the circuit 300, the voltage V(P) can be measured with respect to the switching node LX. The voltage at the switching node V(LX) may vary over time. For instance, V(LX) which may be a positive voltage or a negative voltage and may be expressed as the sum of the voltage drop Vshunt across the resistance 310 and the drain-source voltage Vds of the low-side power switch LS 210 as:

$$V(LX)=Vshunt+Vds(LS) \quad (3)$$

The voltage V(LX) may be measured via the transistor M6 332. When the transistor M6 is ON (closed), the voltage V(LX) is equal to the voltage at the source terminal of M6 which can be expressed as the difference between the gate voltage and the threshold voltage of M6 as:

$$Vsource(M6)=Vgate(M6)-Vth(M6) \quad (4)$$

The reference voltage source 336 uses the switching node voltage V(LX) as a virtual ground. The transistor M6 332 can be turned on at any time, and independently of the state of the low side power switch 210, to sense V(LX). Since the reference source 336 is coupled to the LX node via the transistor M6, the voltage variations at the switching node will be compensated.

The output of the comparator 334 is proportional to a difference between the voltage at node S and the voltage at node LX. When transistor M3 323, M4 234 and current switch 238 are on (closed), the voltage at node S is equal to the voltage at node P, and the output of the comparator 334 is proportional to the voltage at node P with respect to V(LX).

When V(P) and hence Vboot falls below a threshold value, the current source 244 of the charge circuit 240 is activated to charge the capacitor Cboot up to the required voltage. The current source 244 provides a charge current IL which flows to the ground via the capacitor C1 222, the low-side power switch 210, and the shunt resistance 310.

The voltage reference 336 may be tuned to regulate the voltage Vboot to a voltage required for operating the high-side power switch 205. For instance, the voltage reference 336 may be tuned such that the voltage Vboot is above a minimum threshold value.

The gate voltages of the transistors M4 234 and M5 242 may vary for example between 0V and 11V. The gate voltages of the low-side power switch LS 210 and of the transistor M6 232 may vary for example between 0V and 6V.

In the circuit 300 the charging current I1 loads the resistance 310. If the charging current I1 becomes significant, then it can affect the measurement of V(LX). For example, if LX is coupled to an inductor L providing an inductor current IL of 1A, and if I1=100 mA, then the current flowing through Rshunt will be IL+I1. Since the current I1, is known it is possible to subtract its contribution to the measurement. Alternatively, it is also possible to prevent the charging current from loading the resistance 310.

Figure 4:
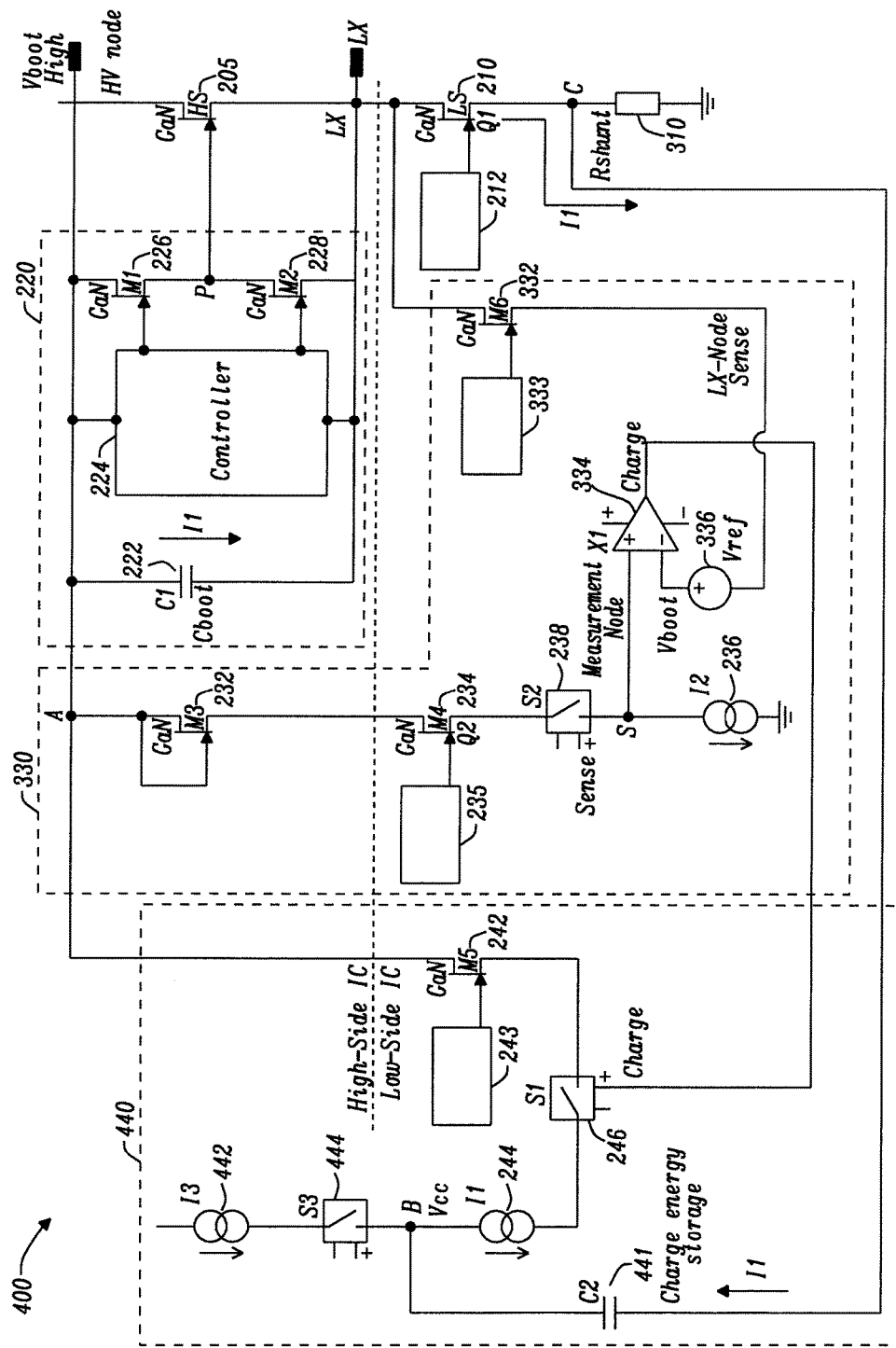
FIG. 4 is diagram of yet another circuit for implementing the method of FIG. 1.

FIG. 4 illustrates another circuit 400 designed to prevent loading of the shunt resistor. The converter 400 of FIG. 4 shares many similar components to those illustrated in the circuit 300 of FIG. 3. The same reference numerals have been used to represent corresponding components and their description will not be repeated for sake of brevity.

The circuit 400 is provided with a modified charger circuit 440, that includes an additional energy storage element, such as a capacitor C2 441. The capacitor 441 has a first terminal coupled to the current source 244 at node B and a second terminal coupled to the shunt resistance 310 and to the low-side power switch 210 at node C. The charger circuit 440 has also been modified to include a third current source 442 and a third current switch 444. The third current source 442 is coupled to the current source 244 via the third current switch 444.

In operation, when the low-side power switch 210 is off (open), the current switch 444 is turned on (closed) and the current source 442 provides a current I3 to charge the capacitor C2 441. When the low-side power switch 210 is on (closed), the current switch 444 is turned off (open), and the charging current I1 charges the capacitor C2 441 via C1 222, LS 210 and node C. As a result, the charge current I1 does not flow through Rshunt 310.

The transistors M3, M4, M5 and M6 as described in FIGS. 2, 3 and 4, may be implemented using either an enhancement mode device or a depletion mode device. Depending on a choice of device, a different controller may be required.

Figure 5:
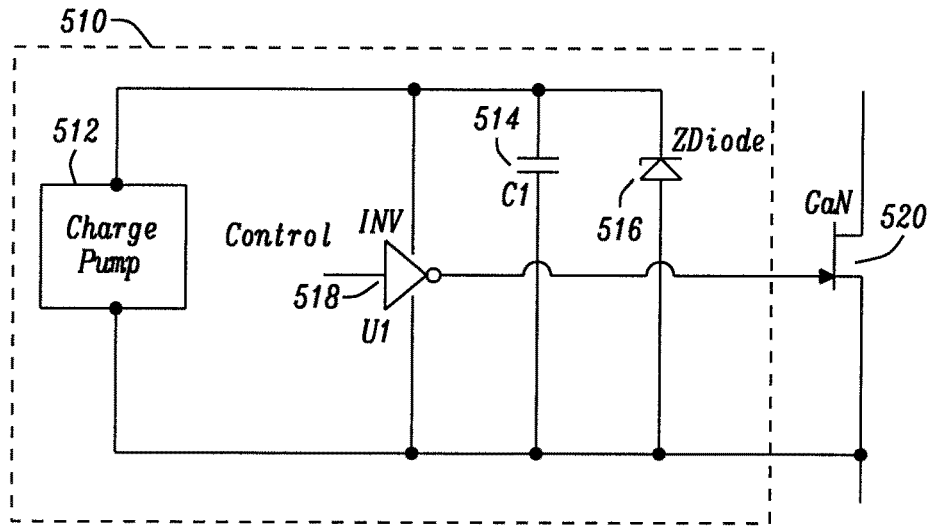
FIG. 5 is a controller for controlling an enhancement mode device.

FIG. 5 illustrates a controller 510 for controlling an enhancement mode device 520, such as an enhancement mode high-electron-mobility transistor E-HEMT. The controller 510 includes a charge pump 512, coupled in parallel to a capacitor 514 and a Zener diode 516. An inverter 516 is coupled to the gate of the enhancement mode device 520. The inverter is used in order to speed up the on-off switching of the enhancement mode device 520. The Zener diode is used as a protection device to limit the gate source voltage of the device 520.

Figure 6:
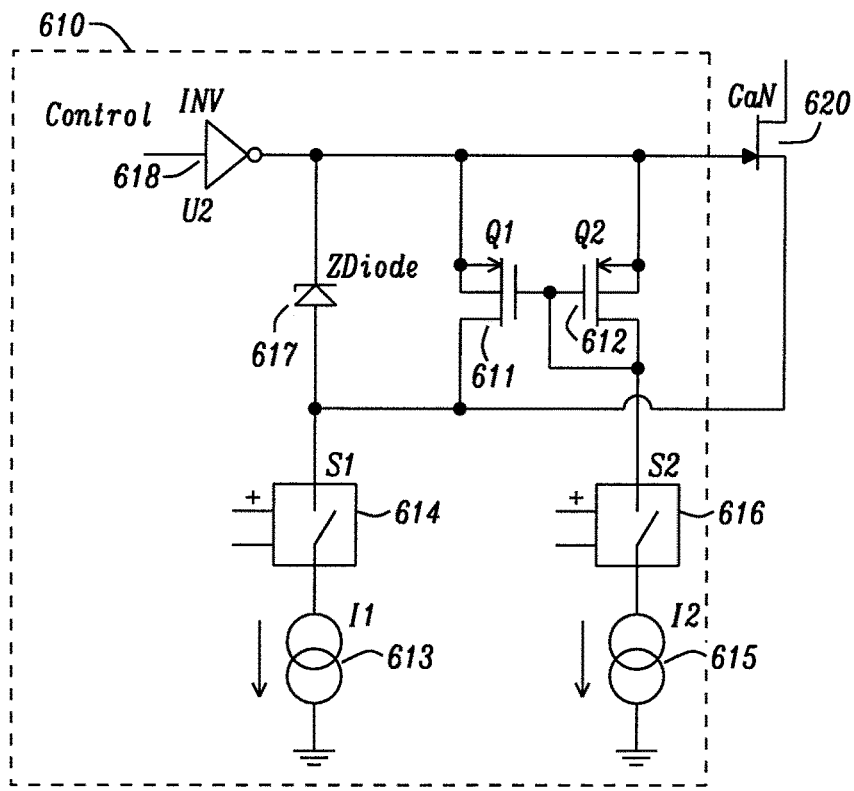
FIG. 6 is a controller for controlling a depletion mode device.

FIG. 6 illustrates a controller 610 for controlling a depletion-mode device 620, such as a depletion mode high-electron-mobility transistor D-HEMT. The controller 610 includes a current mirror formed by first and second transistors Q1 611, Q2 612. The first transistor Q1 611 is coupled to a first current source 613 via a first current switch 614. Similarly, the second transistor 612 is coupled to a second current source 615 via a second current switch 616. A Zener diode 617 is provided in parallel with the current mirror, between the gate terminal and the source terminal of the device 620. An inverter 618 is coupled to the gate terminal of the device 620. The controller for a depletion mode device does not require a charge pump. Hence, using a depletion-mode device instead of a enhancement-mode device can lower the cost of implementation of the circuit.

Any of the circuit described above with reference to FIGS. 2 to 6 may be implemented wholly, or in part based on III/V semiconductors such as Gallium Nitride, GaN.

A skilled person will appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. An electronic circuit comprising:
   a first power switch coupled to a second power switch via a switching node;

a driver coupled to the first power switch, wherein the driver comprises an energy storing element coupled to the switching node;
a sensor to sense an electrical parameter of the driver; and
a charger coupled to the sensor and to the energy storing element, the charger being adapted to provide a charge current to charge the energy storage element, and to control the charge current based on the electrical parameter;
wherein the driver is adapted to provide a drive voltage to the first power switch, and wherein the electrical parameter is indicative of the drive voltage;
wherein the driver comprises a first transistor adapted to control the drive voltage; and wherein the sensor comprises a second transistor coupled to a first current source; wherein the second transistor is substantially identical to the first transistor.

2. The electronic circuit as claimed in claim 1, wherein the electrical parameter comprises at least one of a voltage, a current, a resistance and a temperature.

3. The electronic circuit as claimed in claim 1, wherein the sensor is adapted to sense the electrical parameter with respect to the switching node.

4. The electronic circuit as claimed in claim 1, wherein the sensor comprises a comparator adapted to compare a first voltage with a reference voltage, and to generate a control signal to control the charger based on the comparison.

5. The electronic circuit as claimed in claim 4, wherein the reference voltage is adapted to vary with respect to a voltage at the switching node.

6. The electronic circuit as claimed in claim 4, wherein the sensor comprises
a third transistor coupled to the second power switch; and
a reference voltage source coupled to the comparator and to the third transistor.

7. The electronic circuit as claimed in claim 1, wherein the charger comprises a charging switch coupled to a second current source.

8. The electronic circuit as claimed in claim 7, wherein the charger comprises a second energy storing element coupled to the second current source and to the second power switch.

9. The electronic circuit as claimed in claim 1, wherein the second power switch is coupled to a ground via a resistance.

10. The Circuit as claimed in claim 1, wherein the circuit is made at least in part based on a III/V semiconductor.

11. The circuit as claimed in claim 10, wherein the first power switch is based on the III/V semiconductor.

12. The circuit as claimed in claim 10, wherein the III/V semiconductor comprises Gallium Nitride.

13. A method of powering a power switch driver adapted to provide a drive voltage, the driver comprising an energy storing element and a first transistor adapted to control the drive voltage, the method comprising
providing a sensor comprising a second transistor coupled to a first current source; wherein the second transistor is substantially identical to the first transistor;
sensing an electrical parameter of the driver, wherein the electrical parameter is indicative of the drive voltage; and
adjusting a current to charge the energy storing element based on the electrical parameter.

14. The method as claimed in claim 13, wherein the electrical parameter is sensed with respect to a switching node.

15. The method as claimed in claim 13, comprising comparing the electrical parameter with a reference, and generating a control signal to adjust the current based on the comparison.

16. The method as claimed in claim 15, wherein the reference is a reference voltage adapted to vary with respect to a voltage at the switching node.

* * * * *